United States Patent [19]
Bae

[11] Patent Number: 5,705,300
[45] Date of Patent: Jan. 6, 1998

[54] PHASE SHIFT MASK AND METHOD FOR FABRICATING THE SAME

[75] Inventor: Sang Man Bae, Kyoungki-do, Rep. of Korea

[73] Assignee: Hyundai Electronics Industries Co., Ltd., Rep. of Korea

[21] Appl. No.: 540,869

[22] Filed: Oct. 11, 1995

[30] Foreign Application Priority Data

Oct. 12, 1994 [KR] Rep. of Korea .................. 94-26083

[51] Int. Cl.⁶ .................................................. G03F 9/00
[52] U.S. Cl. .................................... 430/5; 430/322
[58] Field of Search ........................ 430/5, 322, 323, 430/324

[56] References Cited

U.S. PATENT DOCUMENTS

| 5,437,947 | 8/1995 | Hur et al. | 430/5 |
| 5,543,254 | 8/1996 | Kim et al. | 430/5 |

Primary Examiner—S. Rosasco
Attorney, Agent, or Firm—Morgan & Finnegan, LLP

[57] ABSTRACT

A phase shift mask having a uniform thickness at a phase shift region. The phase shift mask includes a quartz substrate provided with a plurality of grooves, a chromium pattern coated over the grooves and every other portion of the quartz substrate disposed between the grooves, and a phase shift material pattern coated over the portion of the quart substrate not covered with the chromium pattern, the phase shift material pattern overlapping with the portions of the chromium pattern disposed at opposite sides of the portion of the quartz substrate not covered with the chromium pattern. This phase shift mask is fabricated by forming the chromium pattern such that it is flush with the quartz substrate at its edge. By this phase shift mask, it is possible to prevent the phase shift material pattern overlapping with the chromium pattern from having a non-uniform thickness due to the topology of the chromium pattern.

5 Claims, 2 Drawing Sheets

PHASE SHIFT MASK AND METHOD FOR FABRICATING THE SAME

BACKGROUND OF THE INVENTION

1. Field of the Invention

The present invention relates to a phase shift mask used in the manufacture of semiconductor devices and a method for fabricating the same, and more particularly to a chromium mask for preventing a phase shift material pattern formed at a phase shift region from having a non-uniform thickness due to the topology of the chromium pattern and a method for fabricating such a chromium mask.

2. Description of the Prior Art

In order to form patterns having a critical dimension in the fabrication of semiconductor devices with a high integration degree of 256 Mega Dynamic Random Access Memory or greater, a high resolution phase shift mask should be used. Such high resolution phase shift mask requires an accuracy in thickness and mask alignment upon depositing a phase shift material layer on the phase shift mask.

Where a phase shift material is coated over a lower pattern having a certain topology in a conventional manner, it has a degraded uniformity in thickness due to the topology of the lower pattern. In the case of a highly integrated pattern which has a minimized pattern size on a reticle, its thickness uniformity varies greatly in accordance with the phase shift material coated over the pattern.

An example of conventional phase shift masks is illustrated in FIG. 1. As shown in FIG. 1, a plurality of spaced chromium patterns 3 having a thickness d are formed on a quartz substrate 4. A phase shift material pattern 2 comprised of, for example, a spin-on-glass (SOG) film is formed on the quartz substrate 4 between every other space between adjacent chromium patterns 3 such that it overlaps partially with the chromium patterns 3.

In this case, the phase shift material pattern 2 has a non-uniform thickness due to the topology of the chromium patterns 3. As shown in FIG. 1, the phase shift material pattern 2 has a thickness t' at its portion disposed over the side wall of each chromium pattern 3 while having a thickness t at its portion disposed over the quartz substrate 4. The phase shift material pattern 2 is adapted to shift 180° incident light beams 1' which pass through the pattern. However, the light beams have differently shifted phases from one another after passing through the pattern 2 because of the non-uniform pattern thickness. As a result, it is difficult to fabricate a phase shift mask having an originally designed pattern where a phase shift mask with an inaccurate pattern is used, patterns formed over the wafer have different critical dimensions.

Meanwhile, an incident light beam 1, which passes directly through the quartz substrate 4, has a phase shift of 0°.

SUMMARY OF THE INVENTION

Therefore, an object of the invention is to provide a phase shift mask having a uniform thickness at a phase shift region and a method for fabricating such a phase shift mask by forming a chromium pattern which is flush with a quartz substrate at its edge, thereby being capable of preventing a phase shift material pattern overlapping with the chromium pattern from having a non-uniform thickness due to the topology of the chromium pattern.

In accordance with one aspect, the present invention provides a phase shift mask comprising: a quartz substrate provided with a plurality of grooves; a chromium pattern coated over the grooves and every other portion of the quartz substrate disposed between the grooves; and a phase shift material pattern coated over the portion of the quartz substrate not covered with the chromium pattern, the phase shift material pattern overlapping with the portions of the chromium pattern disposed at opposite sides of the portion of the quartz substrate not covered with the chromium pattern.

In accordance with another aspect; the present invention provides a method for fabricating a phase shift mask, comprising the steps of: preparing a quartz substrate, and then etching the quartz substrate by use of a mask, thereby forming a plurality of grooves; depositing a chromium layer over the quartz substrate such that the chromium layer fills the grooves, and then etching desired portions of the chromium layer by use of another mask, thereby forming a chromium pattern which overlaps with the grooves and every other portion of the quartz substrate disposed between adjacent ones of the grooves; and coating a phase shift material layer over the resulting structure obtained after the formation of the chromium pattern, and then etching the phase shift material layer by use of another mask, thereby forming a phase shift material pattern, the phase shift material pattern having uniform thickness at a phase shift region.

BRIEF DESCRIPTION OF THE DRAWINGS

Other objects and aspects of the invention will become apparent from the following description of an embodiment with reference to the accompanying drawings in which.

DETAILED DESCRIPTION OF THE PREFERRED EMBODIMENTS

FIGS. 2A to 2D illustrate sequential steps of a method for fabricating a phase shift mask in accordance with an embodiment of the present invention.

Figure 1:
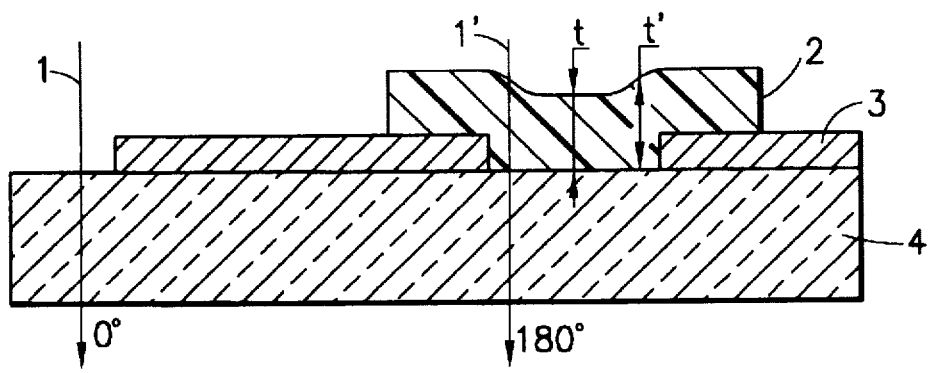
FIG. 1 is a sectional view illustrating a conventional phase shift mask.
Figure 2A:
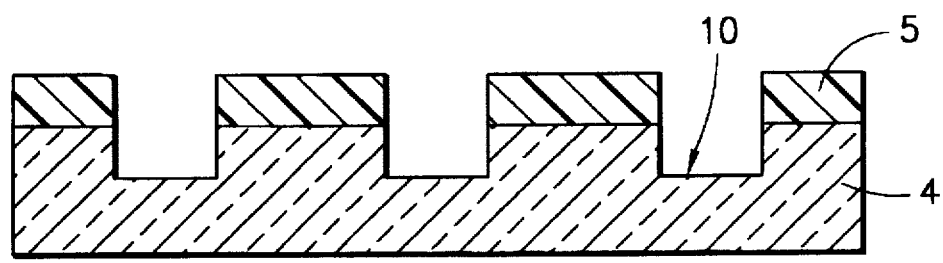
FIGS. 2A to 2D are sectional views illustrating sequential steps of a method for fabricating a phase shift mask in accordance with the embodiment of the present invention.

In accordance with the present invention, a photoresist material is coated over a quartz substrate 4 and then patterned using a mask (not shown) in accordance with an exposure and development process, thereby forming a photoresist pattern 5, as shown in FIG. 2A. Using this photoresist pattern 5 as a mask, the quartz substrate 4 is then etched in accordance with a reactive ion etching process, thereby forming grooves 10. The etched depth of the quartz substrate 4 corresponds to the thickness of a chromium pattern to be subsequently deposited.

Figure 2B:
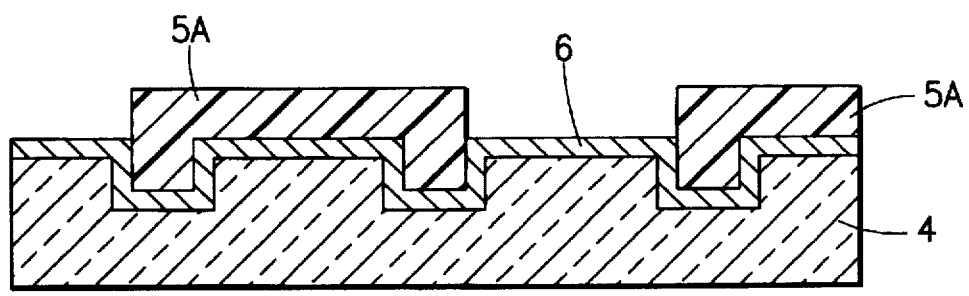
Figure 2C:
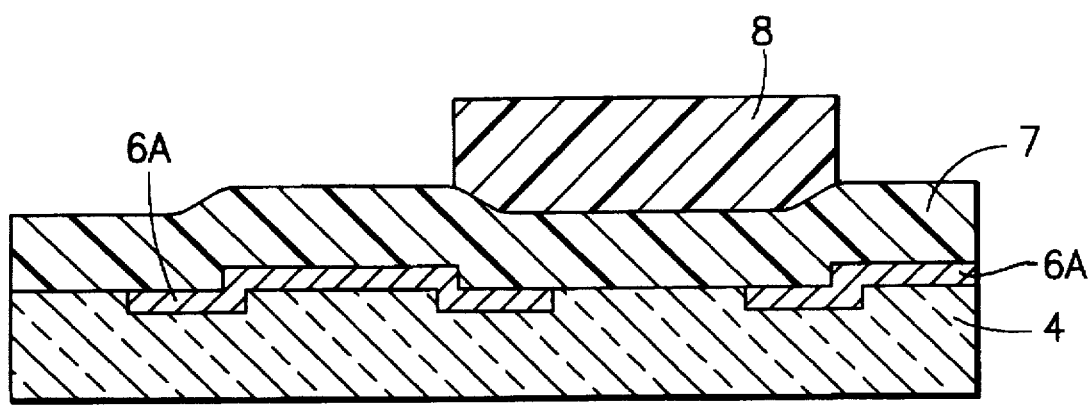

The photoresist pattern is then removed, as shown in FIG. 2B. Thereafter, a chromium layer 6 is deposited over the quartz substrate 4. On the chromium layer 6, a photoresist pattern 5A as a chromium pattern mask is then formed.

Subsequently, the chromium layer 6 is etched at its portion not covered with the photoresist pattern 5A, thereby forming a chromium pattern 6A which overlaps with the grooves 10. The photoresist pattern 5A is then removed. Over the resulting structure, a phase shift material layer 7 is then coated. On the phase shift material layer 7, a photoresist pattern 8 as a phase shift material pattern mask is formed.

Figure 2D:
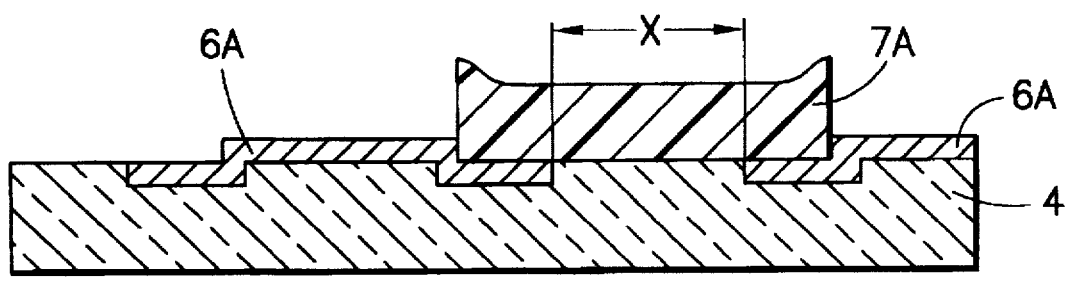

Using the resist pattern 8, the phase shift material layer 7 is etched, thereby forming a phase shift material pattern 7A, as shown in FIG. 2D. Thus, the phase shift material pattern 7A has a uniform thickness at a phase shift region x.

As apparent from the above description, the chromium pattern is formed such that it is flush with the quartz substrate at its edge portion. Accordingly, the phase shift material layer has a uniform thickness at the phase shift region. It, therefore, is possible to maximize the phase shift effect exhibited upon forming a critical dimension photoresist pattern on a wafer using the phase shift mask fabricated in accordance with the present invention. By virtue of the maximized phase shift effect, an improvement in the quality of the phase shift mask is achieved.

Although the preferred embodiment of the invention has been disclosed for illustrative purposes, those skilled in the art will appreciate that various modifications, additions and substitutions are possible, without departing from the scope and spirit of the invention as disclosed in the accompanying claims.

What is claimed is:

1. A phase shift mask comprising:

a quartz substrate provided with a plurality of grooves;

a chromium pattern coated over the grooves and alternating adjacent portions of the quartz substrate disposed between the grooves; and a phase shift material pattern coated over the portion of the quartz substrate not covered with the chromium pattern, the phase shift material pattern overlapping with portions of the chromium pattern disposed at opposite sides of the quartz substrate not covered with the chromium pattern.

2. The phase shift mask in accordance with claim 1, wherein the grooves have a depth substantially equal to a thickness of the chromium pattern.

3. A method for fabricating a phase shift mask comprising the steps of:

preparing a quartz substrate, and then etching the quartz substrate by use of a mask, thereby forming a plurality of grooves;

depositing a chromium layer over the quartz substrate such that the chromium layer fills the grooves, and then etching desired portions of the chromium layer by use of another mask, thereby forming a chromium pattern which overlaps with the grooves and alternating adjacent portions of the quartz substrate disposed between adjacent ones of the grooves; and coating a phase shift material layer over the resulting structure obtained after the formation of the chromium pattern, and then etching the phase shift material layer by use of another mask, thereby forming a phase shift material pattern, the phase shift material pattern having uniform thickness at a phase shift region.

4. The method in accordance with claim 3, wherein the step of forming the grooves is carried out using a reactive ion etching process.

5. The method in accordance with claim 3, wherein the grooves have a depth substantially equal to a thickness of the chromium pattern.

* * * * *